United States Patent [19]

Takeuchi et al.

[11] Patent Number: 4,903,027
[45] Date of Patent: Feb. 20, 1990

[54] A/D CONVERTER COMPRISING ENCODER PORTION HAVING FUNCTION OF MULTIPLYING ANALOGUE INPUT BY DIGITAL INPUT

[75] Inventors: Sumitaka Takeuchi; Keisuke Okada, both of Hyogo, Japan

[73] Assignee: Mitsubishi Denki Kabushiki Kaisha, Tokyo, Japan

[21] Appl. No.: 159,405

[22] Filed: Feb. 11, 1988

[30] Foreign Application Priority Data

Feb. 12, 1987 [JP] Japan .................................. 62-30013

[51] Int. Cl.$^4$ ............................................ H03M 1/14
[52] U.S. Cl. ...................................... 341/156; 341/161
[58] Field of Search ................ 341/156, 159, 160, 161

[56] References Cited

U.S. PATENT DOCUMENTS

| 4,131,885 | 12/1978 | Ninomiya | 341/159 |
| 4,291,387 | 9/1981 | Buchanan et al. | 341/126 |
| 4,517,550 | 5/1985 | Nakamura et al. | 341/158 |
| 4,635,036 | 1/1987 | Yoshizawa | 341/156 |
| 4,733,217 | 3/1988 | Dingwall | 341/156 |

FOREIGN PATENT DOCUMENTS 131123  8/1982  Japan .

OTHER PUBLICATIONS

Hnatek, "A User's Handbook of D/A and A/D Converters", (New York: John Wiley & Sons, 1976), p. 323.

Primary Examiner—William M. Shoop, Jr.
Assistant Examiner—Marc S. Hoff
Attorney, Agent, or Firm—Lowe, Price, LeBlanc, Becker & Shur

[57] ABSTRACT

An A/D converter of a serial-parallel comparison type has both multiplying functions of an analog input data and a digital input data. The analog input data $V_X$ is converted into a digital code $I_c$ corresponding to two more significant digits, by a first parallel comparing portion and a first determining circuit, and converted into a digital code $I_f$ corresponding to two less significant digits by a second parallel comparing portion and a second determining circuit. The digital codes $I_c$ and $I_f$ are alternately applied to a control circuit by a first selector circuit. Two more significant bits $R_c$ and two less significant bits $R_f$ of a 4-bit digital input data are respectively applied to a control signal generating circuit by a second selector circuit. Multiplications of $R_c I_c$, $R_f I_c$, $R_c I_f$ and $R_f I_f$ are serially performed within the time period of one conversion by the control signal generating circuit and the control circuit. The multiplied results are shifted four bits, two bits, two bits and 0 bits, respectively, and then, added to each other. As a result, the product of the analogue input data and the digital input data is calculated.

5 Claims, 4 Drawing Sheets

A/D CONVERTER COMPRISING ENCODER PORTION HAVING FUNCTION OF MULTIPLYING ANALOGUE INPUT BY DIGITAL INPUT

BACKGROUND OF THE INVENTION

1. Field of the Invention

The present invention relates to an A/D converter and more particularly, to an A/D converter in which the function of multiplying an analogue input by a digital input is incorporated in advance into an encoder portion for A/D conversion for use in an environment in which such multiplication is required.

2. Description of the Prior Art

Recently, digital integrated circuit techniques have been significantly developed. Thus, even in the field in which various signals were conventionally processed using an analog circuit, such signals have been processed in a digital manner for high performance, high integration and high function. More specifically, when signals which are originally analog, such as an audio signal and a video signal are processed in a digital manner, an A/D converter is required.

FIG. 1 is a circuit diagram showing an example of an A/D converter of a serial-parallel comparison type as one example of such a conventional A/D converter, which is disclosed in, for example, Japanese Patent Laying-Open Gazette No. 131123/1982.

A serial-parallel A/D converter shown in FIG. 1 comprises an input terminal 21 receiving an analogue signal, a first A/D converting portion A of a parallel comparison type and a second A/D converting portion B of a parallel comparison type. More specifically, the first A/D converting portion A of a parallel comparison type comprises voltage comparators 22, 23 and 24 receiving three kinds of reference voltages $V_1$, $V_2$ and $V_3$ as respective inputs obtained by dividing a constant voltage $V_R$ by ladder resistors $R_1$ to $R_{16}$, a determining circuit 25 receiving outputs of the voltage comparators, and an encoder 26 receiving outputs of the determining circuit 25. The encoder 26 has digital output terminals 27a and 27b. In addition, the second A/D converting portion B of a parallel comparison type comprises switches $S_1$ to $S_{12}$ connected to reference voltages $v_1$ to $v_{12}$ applied by the ladder resistors $R_1$ to $R_{16}$, respectively, the switches being divided into a first group $C_1$ of switches, a second group $C_2$ of switches, a third group $C_3$ of switches and a fourth group $C_4$ of switches. Opening or closing of the switches in respective groups is controlled by control signals from the determining circuit 25. The second A/D converting portion B of a parallel comparison type further comprises voltage comparators 28, 29 and 30 receiving reference voltages as respective one inputs obtained through the group of switches selected by the control signal, a determining circuit 31 receiving outputs of the voltage comparators, and an encoder 32 receiving outputs of the determining circuit 31. The encoder 32 has digital output terminals 33a and 33b.

Description is now made on operation of the conventional A/D converter of a serial-parallel comparison type shown in FIG. 1.

When an analogue input signal $V_X$ is applied to the input terminal 21, the signal is applied to the respective input terminals of the voltage comparators 22, 23 and 24 in common. On the other hand, the reference voltages $V_1$, $V_2$ and $V_3$ generated by dividing a constant voltage $V_R$ by the ladder resistors $R_1$ to $R_{16}$ are applied to the other input terminals of the voltage comparators 22, 23 and 24, respectively. Each of the voltage comparators compares the applied analogue input signal with the reference voltage. If the analog input signal is larger, the voltage comparator outputs a signal at an "H" level. For example, when the analog input signal $V_X$ is in the range of $V_2<V_X<V_1$, the output of the voltage comparator 22 is at an "L" level and the outputs of the voltage comparators 23 and 24 are at the "H" level.

The determining circuit 25 receives the outputs of the voltage comparators 22, 23 and 24 determines that the analogue input signal $V_X$ is a value within the range of $V_2<V_X<V_1$ and applies a signal representing the determined results to the encoder 26. Correspondingly, the encoder 26 outputs a digital signal of more significant digits corresponding to the analogue input signal $V_X$ through the output terminal 27a and 27b. Consequently, a first A/D converting operation is completed.

The determining circuit 25 applies a control signal for closing each of the switches $S_1$ to $S_3$ in the group $C_1$ of switches when it determines that the analog input signal $V_X$ is larger than the reference voltage $V_1$, a control signal for closing each of the switches $S_4$ to $S_6$ in the group $C_2$ of switches when it determines that $V_X$ is between $V_1$ and $V_2$, a control signal for closing each of the switches $S_7$ to $S_9$ in the group $C_3$ of switches when it determines that $V_X$ is between $V_2$ and $V_3$, and a control signal for closing each of the switches $S_{10}$ to $S_{12}$ in the group $C_4$ of switches when it determines that $V_X$ is smaller than $V_3$.

For example, if and when the determining circuit 25 determines that $V_X$ is between $V_1$ and $V_2$ as described above, the switches $S_4$ to $S_6$ in the group $C_2$ of switches are closed. As a result, the reference voltages $v_4$, $v_5$ and $v_6$ are applied to the respective one input terminals of the voltage comparators 28, 29 and 30. The analogue input signal $V_X$ is applied to the respective other input terminals of the voltage comparators 28, 29 and 30 through the input terminal 21 in common. Each of the voltage comparators compares the applied analogue inpu signal with the reference voltage. If the analogue input signal is larger, the comparator outputs a signal at the "H" level. The determining circuit 31 receives the outputs of the voltage comparators 28, 29 and 30 and determines whether the analogue input signal $V_X$ takes a value between $V_1$ and $v_4$, a value between $v_4$ and $v_5$, a value between $v_5$ and $v_6$ or a value between $v_6$ and $V_2$. The encoder 32 is responsive to the determination output for outputting a digital signal of less significant digits corresponding to the input analogue signal $V_X$ through the output terminals 33a and 33b.

Thus, the A/D converter of a serial-parallel comparison type shown in FIG. 1 is adapted such that it is determined that the analogue signal $V_X$ exists, for example, between the reference voltages $V_1$ and $V_2$ so that a digital code of more significant digits is obtained, by the first A/D converting portion A of a parallel comparison type, and a digital code of less significant digits is obtained to achieve higher resolution, by the second A/D converting portion B of a parallel comparison type.

Meanwhile, in a digital integrated circuit such as a digital filter, it is necessary that an analog input is converted into digital data and then, the digital data is multiplied by another digital input. In such a case, an output of an A/D converter has been conventionally applied to a multiplier in another chip. Hoever, such a structure presents difficulty in providing high integration. A circuit having both functions of an A/D converter and a multiplier on a single chip, which is described in, for example, U.S. Pat. application No. 111,047, filed Oct. 21, 1987.

FIG. 2 is a circuit diagram showing an example of such a semiconductor integrated circuit, which is adapted such that the encoder portion (for example, corresponding to the encoder 26 or 32 shown in FIG. 1) of an A/D converter of a parallel comparison type has a function of multiplying an output of a determining circuit (for example, corresponding to the determining circuit 25 or 31 shown in FIG. 1) by another digital input and outputting the result.

Referring to FIG. 2, a constant voltage is supplied through an input terminal 41, the constant voltage being divided by ladder resistors 42 to 45 so that reference voltages Va, Vb and Vc are obtained. The reference voltages Va, Vb and Vc are applied to respective one input terminals of voltage comparators 46, 47 and 48. At the same time an analog inpu signal $V_X$ inputted through an input terminal 49 is applied to the respective other inputs of the voltage comparators 46, 47 and 48 in common. Each of the voltage comparators compares the applied analogue input signal with the reference signal and outputs a signal at an "H" level when the analogue input signal is larger. A determining circuit 50 receives outputs of the voltage comparators 46, 47 and 48 and determines whether the analogue input signal $V_X$ takes a value larger than Va, a value between Va and Vb, a value between Vb and Vc or a value smaller than Vc. Output signals $A_3$, $A_2$, $A_1$ and $A_0$ of the determining circuit 50 are applied to a control circuit 51 having a multiplying function corresponding to the encoder portion of the A/D converter. A control signal generating circuit 54 is responsive to other digital input signals $R_1$ and $R_0$ applied to input terminals 52 and 53 for generating control signals and applying the same to the control circuit 51. The control circuit 51 comprises a plurality of transfer gates 55 to 62 and a plurality of OR gates 63 to 65. The results of multiplying the analogue input signal $V_X$ by the digital input signals $R_1$ and $R_0$ are outputted from the control circuit 51 as digital signals $X_3$, $X_2$, $X_1$ and $X_0$.

Operation of the circuit shown in FIG. 2 is now described. Briefly stated, description is made on a case in which the analog input signal applied through the input terminal 49 takes a value "2" and the digital data applied through the input terminals 52 and 53 takes a value "3".

When the analog input signal $V_X$ is applied to the input terminal 49, the signal $V_X$ is applied to respective one input terminals of the voltage comparators 46, 47 and 48 in common. The reference voltages Va, Vb and Vc generated by dividing a voltage by the ladder resistors 42 to 45 are applied to their other input terminals of the voltage comparators 46, 47 and 48, respectively. In this case, since the analog input signal which takes a value "2", which is a value between Va and Vb. Thus, the output of the voltage comparator 46 attains the "L" level and the outputs of the voltage comparators 47 and 48 attain the "H" level.

The determining circuit 50 receives the outputs of the voltage comparators 46, 47 and 48, determines that the analogue input signal $V_X$ takes a value in the range of $Vb < V_X < Va$, and applies signals representing the determined result to the control circuit 51. More specifically, the determining circuit 50 determines the output levels of the voltage comparators 46, 47 and 48 arranged in parallel, and provides an output indicating a voltage comparator corresponding to a most significant digit, of voltage comparators which generate "1" (a high level) thereamong. For example, when the analogue input signal $V_X$ takes a value "2∞, the outputs of the voltage comparators 46, 47 and 48 are "0", "1" and ;b "1", the output "1" of a most significant digit thereof being applied by the voltage comparator 47. Thus, only the signal $A_2$ corresponding to the voltage comparator 47, of the outputs $A_3$, $A_2$, $A_1$ and $A_0$ of the determining circuit 50 is "1" and all of the other signals $A_3$, $A_1$ and $A_0$ are "0". In addition, when the analog input signal $V_X$ is less than $V_C$, for example, all of the outputs of the voltage comparators 46, 47 and 48 are "0" (a low level). In this case, only the output $A_0$ of the determining circuit 50 is "1" and all of the other outputs $A_3$, $A_2$ and $A_1$ are "0".

The control signal generating circuit 54 receives the digital input signals $R_1$ and $R_0$, generates five kinds of control signals $R_0$, $R_1 + R_0$, $R_1$, $R_1 \cdot R_0$ and $R_1 R_0$ and supplies the same as gate signals of the transfer gates constituting the control circuit 51. When the digital input data takes a value "3" as described above, both $R_1$ and $R_0$ are "1". Thus, the above described five kinds of control signals are "1", $\int 0$", "1", "0" and "1" in this order. Consequently, the transfer gates 55, 57, 59, 60, 61 and 62 are turned on and the transfer gates 56 and 58 are turned off. Thus, when the analog input signal takes a value "2", that is, $A_3$ equals 0, $A_2$ equals 1, $A_1$ equals 0 and $A_0$ equals 10, the outputs $X_3$, $X_2$, $X_1$ and $X_0$ of the control circuit 51 $X_3$ equals 0, 1, 1 and 0, respectively, which indicates a value "6". More specifically, the value "6" indicates "2×3" corresponding to the result of multiplying the value "2" of the analogue input signal by the value "3" of the digital input data.

However, in the above described semiconductor integrated circuit, the structures of the above described control signal generating portion and the control circuit are both complicated and the area of the circuit is significantly increased if the number of input bits is increased.

SUMMARY OF THE INVENTION

Therefore, a primary object of the present invention is to provide an A/D converter in which an encoder portion can perform a function of multiplying an analogue input data by a digital input data at high speed without increasing the area of a circuit.

Briefly stated, the present invention is directed to an A/D converter in which a first digital code Ic which provides a basis for A/D conversion of n/2 (n: a positive integer) more significant digits and a second digital code If which provides a basis for A/D conversion of n/2 less significant digits are obtained in response to an analogue input data, four kinds of multiplications of Rc×Ic, Rf×Ic, Rc×If and Rf×If are sequentially performed between m/2 (m: a positive integer) more significant bits $R_c$ of a m-bit digital input data and m/2 less significant bits $R_f$ thereof within the time period of one conversion, and the results of the multiplications are shifted a predetermined number of bits, respectively, and added to each other.

Thus, a principal advantage of the present invention is that functions of A/D conversion and multiplication can be achieved on a single chip without complicating the circuit structure even if the number of input bits is large.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
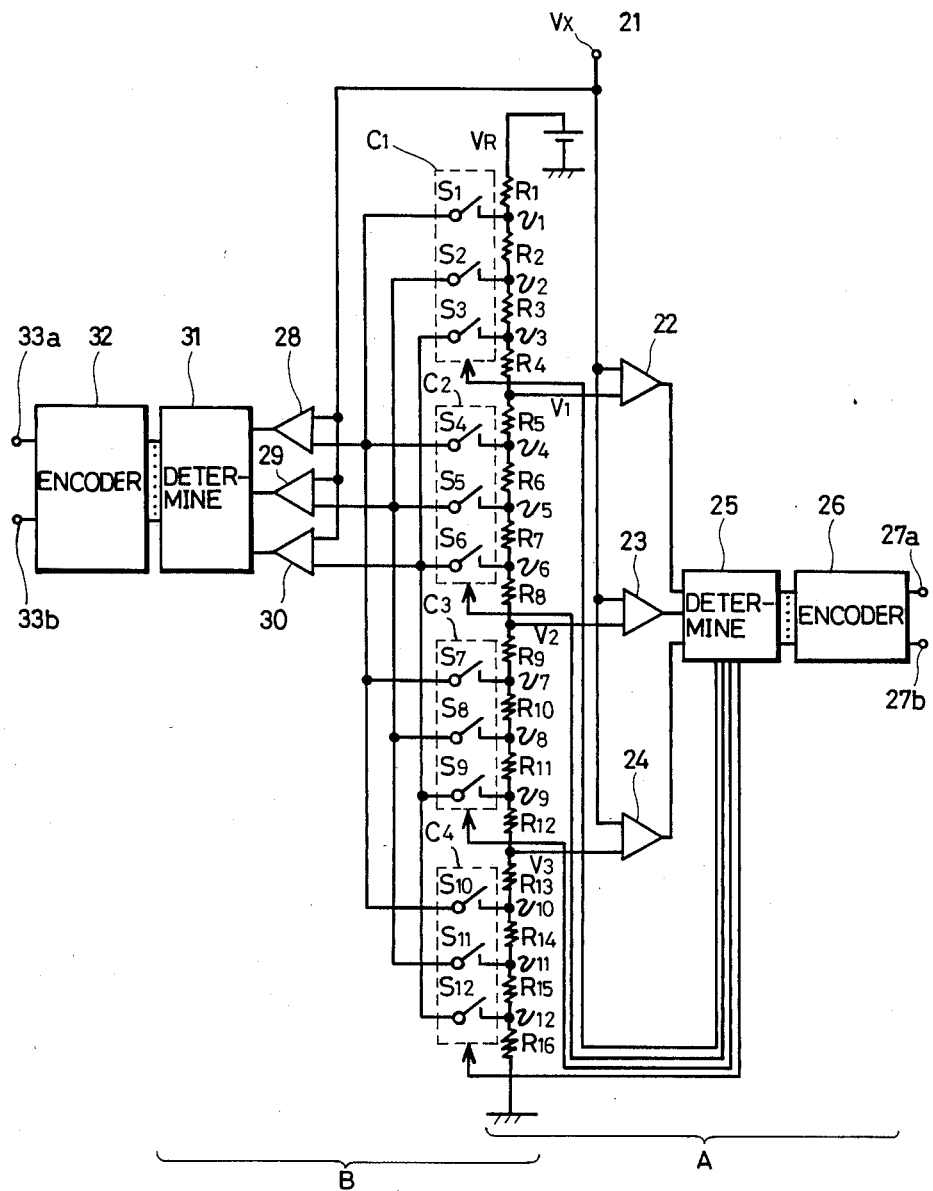
FIG. 1 is a circuit diagram showing an example of a conventional A/D converter of a serial-parallel comparison type.
Figure 2:
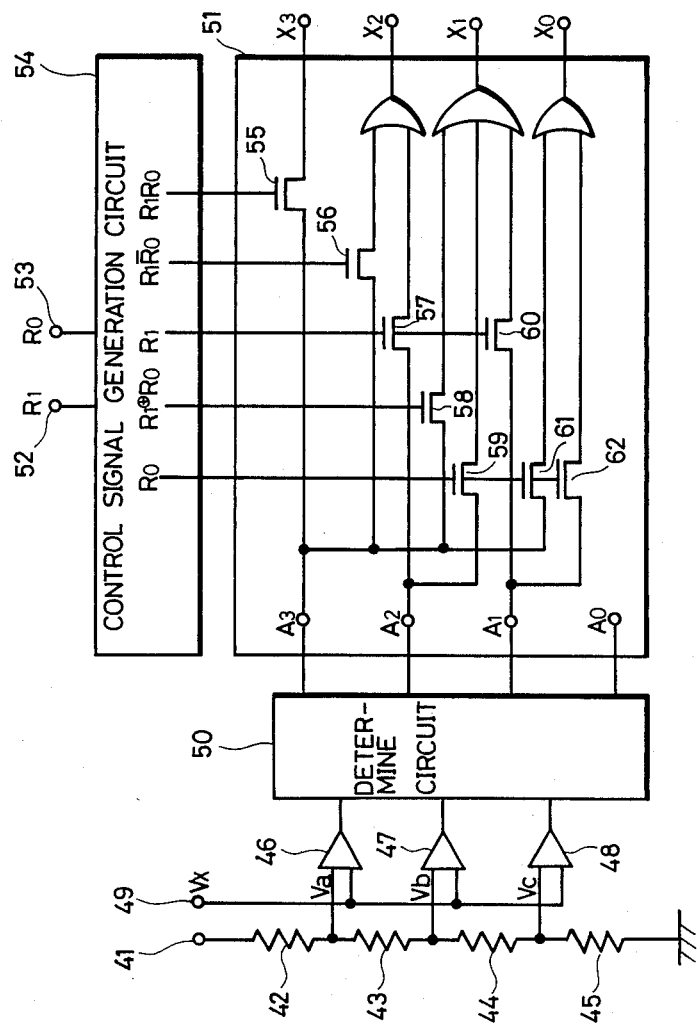
FIG. 2 is a circuit diagram showing an example of an A/D converter having both functions of A/D conversion and multiplication.
Figure 3:
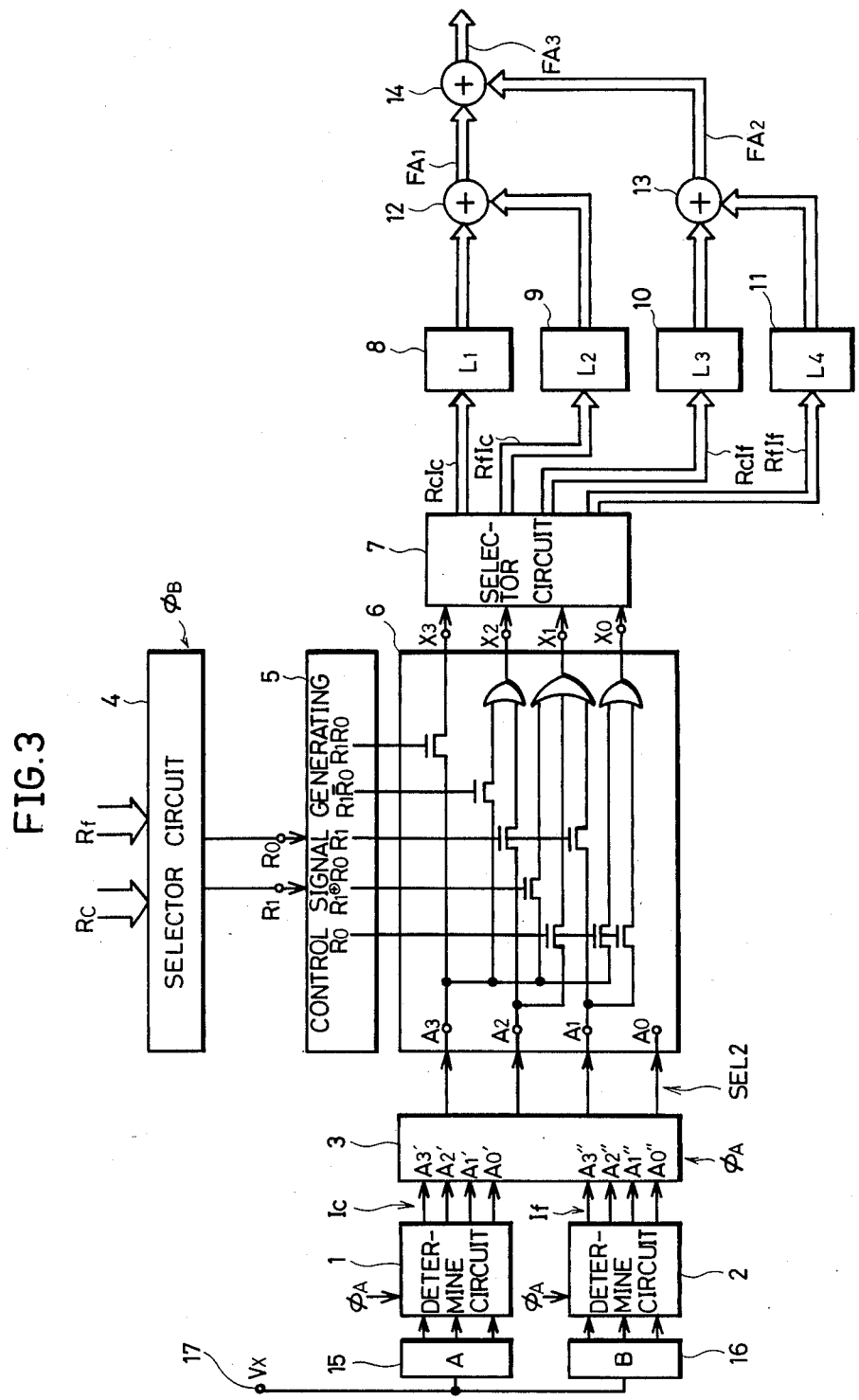
FIG. 3 is a schematic block diagram showing an embodiment of the present invention.

FIG. 3 is a schematic block diagram showing a semiconductor integrated circuit according to an embodiment of the present invention. Referring to FIG. 3, a parallel comparing portion 15 corresponds to remaining portions excluding the determining circuit 25 and the encoder 26 in the first A/D converting portion A of a parallel comparison type shown in FIG. 1, outputs thereof being the results of comparison by the three voltage comparators. In addition, a parallel comparing portion 16 corresponds to remaining portions excluding the determining circuit 31 and the encoder 32 in the second A/D converting portion B of a parallel comparison type shown in FIG. 1, outputs thereof being the results of comparison by the three voltage comparators. Furthermore, a first determining circuit 1 corresponds to the determining circuit 25 shown in FIG. 1 and a second determining circuit 2 corresponds to the determining circuit 31 shown in FIG. 1. The functions of the determining circuits 1 and 2 are the same as that of the determining circuit 50 shown in FIG. 2 and hence, the descriptions thereof are omitted. A first selector circuit 3 selects either outputs of the first determining circuit 1 or outputs of the second determining circuit 2 and applies the same to a control circuit 6.

On the other hand, a 4-bit digital input is applied to a second selector circuit 4 as an input signal $R_c$ of two more significant bits and an input signal Rf of two less significant bits. The selector circuit 4 selects any of them and applies the same to a control signal generating circuit 5. The control signal generating circuit 5 and the control circuit 6 are the same as the control signal generating circuit 54 and the control circuit 51 shown in FIG. 2 and hence, the descriptions thereof are omitted.

Outputs signals $X_3$, $X_2$, $X_1$ and $X_0$ representing the result of multiplication outputted from the control circuit 6 are applied to a third selector circuit 7. The selector circuit 7 is switched to apply the applied result of multiplication to any of latch circuits 8, 9, 10 and 11. A first adder 12 adds shifted outputs of the latch circuits 8 and 9. A second adder 13 adds a shifted output of the latch circuit 10 and an output of the latch circuit 11. In addition, a third adder 14 adds an output of the first adder 12 and an output of the second adder 13.

Referring now to the circuit shown in FIG. 3, the principle of the present invention is described. Briefly stated for illustration, description is made on a case in which an analog input signal $V_X$ takes a value "7" and a digital input data takes a value "6".

The value of the analogue input signal $V_X$ is "7", which is "0111" in binary notation. The parallel comparing portion 15 performs A/D conversion of the two more significant digits of the input signal $V_X$ and applies signals corresponding to "01 (binary notation)"=1 (decimal notation)" to the first determining circuit 1. Thus, the first determining circuit 1 generates a code $I_c$ which satisfies the following relation and applies the same to the first selector circuit 3:

$$A_3'=0, A_2'=0, A_1'=1, A_0'=0$$

On the other hand, the parallel comparing portion 16 performs A/D conversion of the two less significant digits of the input signal $V_X$ and applies signals corresponding to "11 (binary notation)"="3 (decimal notation)" to the second determining circuit 2. Thus, the second determining circuit 2 generates a code $I_f$ which satisfies the following relation and applies the same to the first selector circuit 3:

$$A_3''=1, A_2''=0, A_1''=0, A_0''=0$$

On the other hand, the value of the digital input data is "6", which is "0110" in binary notation. Thus, the input signal $R_c$ of two more significant bits is "01 (binary notation)"="1 (decimal notation)" and the input signal Rf of two less significant bits is "10 (binary notation)"="2 (decimal notation)".

The first selector circuit 3 selects the code Ic and the second selector circuit 4 selects the signal Rc, so that a multiplication of $R_c \times I_c$="1×1" is performed in the control circuit 6. The result is as follows:

$$R_c I_c = \text{"0001 (binary notation)"}$$
$$= \text{"1 (digital notation)"}$$

The result is held in the latch circuit 8.

Then, the first selector circuit 3 continues to select the code $I_c$, whereas the second selector circuit 4 selects the signal $F_f$, so that a multiplication of $R_f \times I_c$ "2×1" is performed in the control circuit 6. The result is as follows:

$$R_f I_c = \text{"0010 (binary notation)"}$$
$$= \text{"2 (decimal notation)"}$$

The result is held in the latch circuit 9.

Then, the first selector circuit 3 selects the code If, whereas the second selector circuit 4 selects the signal $R_c$, so that a multiplication of $R_c \times I_f$="1×3" is performed in the control circuit 6. The result is as follows:

$$R_c I_f = \text{"0011 (binary notation)"}$$
$$= \text{"3 (decimal notation)"}$$

The result is held in the latch circuit 10.

Then, the first selector circuit 3 continues to select the code $I_f$, whereas the second selector circuit 4 selects the signal Rf, so that a multiplication of $R_f \times I_f$="2×3" is performed in the control circuit 6. The result is as follows:

$$R_f I_c = \text{"0110 (binary notation)"}$$
$$= \text{"6 (decimal notation)"}$$

The result is held in the latch circuit 11.

Then, the first adder 12 adds the result of shifting four bits the above described value of RcIc and the result of shifting two bits the above described value of RfIc. If the result is represented by $FA_1$, the following equation is obtained:

$$FA_1 = \text{``00011000 (binary notation)''}$$
$$= \text{``24 (decimal notation)''}$$

Then, the second adder 13 adds the result of shifting two bits the above described value of $R_cI_f$ and the above described value of $R_fI_f$. If the result is represented by $FA_2$, the following equation is obtained:

$$FA_2 = \text{``00010010 (binary notation)''}$$
$$= \text{``18 (decimal notation)''}$$

Finally, the third adder 14 adds the output of the first adder 12 and the output of the second adder 13. If the result is represented by $FA_3$, the following equation is obtained:

$$FA_3 = \text{``00101010 (binary notation)''}$$
$$\text{``42 (decimal notation)''}$$

Thus, the value represents the result "7×6=42" of multiplying the analogue input "7" by the digital input "6".

More specifically, describing the present invention in a more general manner, in an encoder portion of an n (n: a positive integer)-bit A/D converter of a serial-parallel comparison type, the outputs determined by the first determining circuit 1 of the analogue input signal as represented by $I_c$, the outputs determined by the second determining circuit 2 thereof are represented by If, m/2 (m: a positive integer) more significant bits of an m-bit digital input are represented by $R_f$ and m/2 less significant bits thereof are $R_c$. Four multiplications of $R_c \times I_c$, Rf×Ic, $R_c \times$If and Rf×If are performed within a time period of one A/D conversion of the above described A/D converter of a serial-parallel comparison type and the multiplied results are shifted and added to each other, so that the multiplied results of (m×n) bits are outputted.

In a general expression, this means that the following multiplication is performed:

$$(R_c \times 2^{m/2} + R_f) \times (I_c \times 2^{m/2} + If)$$

Where a multiplication of a particular value by $2^{m/2}$ means that the value is shifted m/2 bits. When the above described expression is expanded, the result is as follows:

$$R_cI_c \times 2^m + R_fI_c \times 2^{m/2} + R_cI_f \times 2^{m/2} + R_fI_f$$

More specifically, the expression means that RcIc is shifted m bits and added, $R_fI_c$ and $R_cI_f$ ar shifted m/2 bits and added and $R_fI_f$ is not shifted but added.

Figure 4:
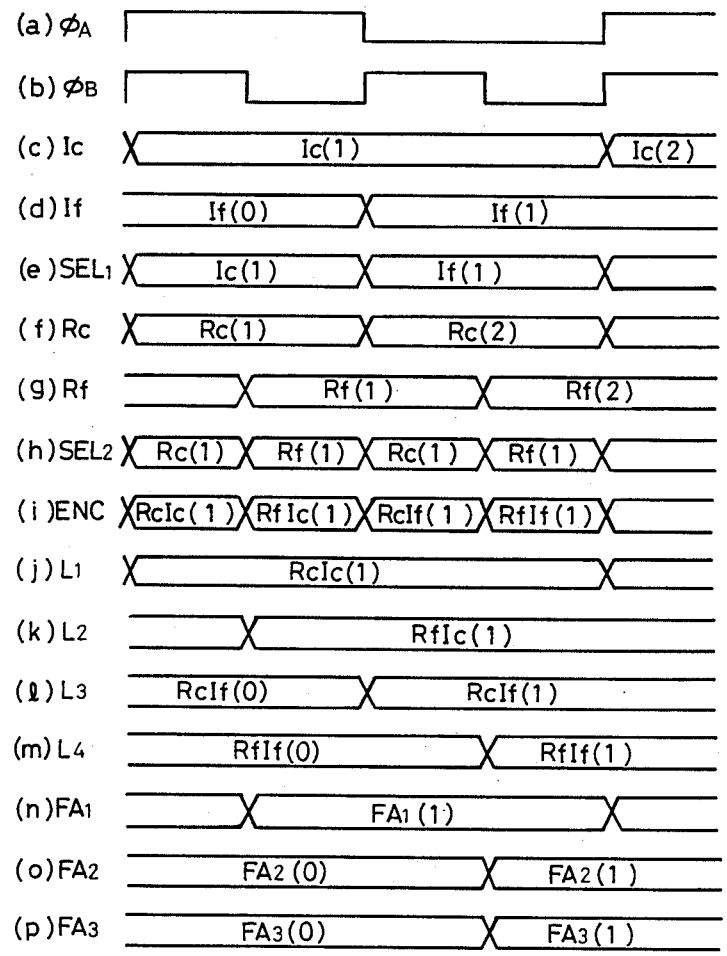
FIG. 4 is a waveform diagram for explaining operation of the embodiment shown in FIG. 3.

FIG. 4 is a waveform diagram for explaining operation of the circuits shown in FIG. 3. Referring to FIGS. 3 and 4, description is made on operation according to an embodiment of the present invention. In FIG. 4, the number given after an indication of each signal shows a flow of the signal.

A signal $\phi_A$ shown in FIG. 4(a) is a clock signal for controlling outputs of the first determining circuit 1 and the second determining circuit 2, and determines the time period of one conversion of the A/D converter of a serial-parallel comparison type. FIG. 4(c) shows an output $I_c$ of the first determining circuit 1, which continues over one cycle of the clock signal $\phi_A$ from each of the rises of $\phi_A$. In addition, FIG. 4(d) shows an output If of the second determining circuit 2, which continues over one cycle of the clock signal $\phi_A$ from each of the falls of $\phi_A$.

A signal $SEL_1$ shown in FIG. 4(e) indicates an output of the first selector circuit 3. The first selector circuit 3 is responsive to the rises and the falls of the clock signal $\phi_A$ for selecting alternately $I_c$ and $I_f$ and outputting the same.

A signal $\phi_B$ shown in FIG. 4(b) is a clock signal having a period which is half of the period of $\phi_A$, which controls timing for switching the second selector circuit 4. In addition, FIG. 4(f) shows a first digital input signal $R_c$, and FIG. 4(g) shows a second digital input signal $R_f$. A signal $SEL_2$ shown in FIG. 4(h) indicates an output of the second selector circuit 4. The second selector circuit 4 is responsive to the rises and the falls of the clock signal $\phi_B$ for selecting alternately Rc and $R_f$ and outputting the same.

A signal ENC shown in FIG. 4(i) is the output of the control circuit 6, indicating the sequentially outputted results of four kinds of multiplications of $R_c \times I_c$, $R_f \times I_c$, $R_c \times I_f$ and $R_f \times I_f$, as described above.

Signals, $L_1$, $L_2$, $L_3$, and $L_4$ shown in FIGS. 4(j), 4(k), 4(l) and 4(m) are signals applied to the latch circuits 8, 9, 10 and 11 by the third selector circuit 7 and held therein. More specifically, $R_cI_c$, $R_fI_c$, $R_cI_f$ and $R_fI_f$ are held in the latch circuits 8, 9, 10 and 11 in order in response to the outputs of the control circuit 6.

A signal $FA_1$ shown in FIG. 4(n) is the output of the first adder 12, which is the result of adding the result of shifting four bits the data $R_cI_c$ of the latch circuit 8 and the result of shifting two bits the data $R_fI_c$ of the latch circuit 9. Furthermore, a signal $FA_2$ shown in FIG. 4(o) is the output of the second adder 13, which is the result of adding the result of shifting two bits the data $R_cI_f$ of the latch circuit 10 and the data $R_fI_p$ of the latch circuit 11.

A signal $FA_3$ shown in FIG. 4(p) is the output of the third adder 14 as described above, which is the result of adding the output $FA_1$ of the first adder 12 and the output $FA_2$ of the second adder 13. The output $FA_3$ represents a product of an analog input and a digital input as described above.

As described in the foregoing, according to the embodiment of the present invention shown in FIG. 3, four kinds of multiplications between the outputs $I_c$ and $I_f$ determined by the first and second determining circuits of the analogue input and the more significant bit signal $R_c$ and the less significant bit signal $R_f$ of the digital input, that is, operations $R_c \times I_c$, $R_f \times I_c$, $R_c \times I_f$ and $R_f \times I_f$ are sequentially performed in the time period of one conversion of the A/D converter and the results are shifted a predetermined number of bits, respectively, and added to each other, so that a multiplying function can be achieved at high speed, the circuit structures of the control signal generating circuit and the control circuit can be simplified and increase in the area of the circuits can be avoided.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. An A/D converter having a multiplying function, comprising:

means for supplying analog input data, means responsive to said analog input data for calculating a first digital code $I_c$ which provides a basis of A/D conversion of n/2 more significant digits, where n is a positive integer, means responsive to said analog input data for calculating a second digital code $I_f$ which provides a basis of A/D conversion of n/2 less significant digits, first selecting means for selecting alternately said first digital code $I_c$ and said second digital code $I_f$ at predetermined timing and outputting the same, means for supplying m-bit digital input data, where m is a positive integer, second selecting means for selecting alternately a first digital signal $R_c$ which is m/2 more significant bits of said digital input data and a second digital signal $R_f$ which is m/2 less significant bits of said digital input data at predetermined timing and outputting the same, multiplying means responsive to the digital code which is outputted from said first selecting means and the digital signal which is outputted from said second selecting means for sequentially performing a first multiplication $R_c \times I_c$, a second multiplication $R_f \times I_c$, a third multiplication $R_c \times I_f$, and a fourth multiplication $R_f \times I_f$ within the time period determined for one A/D conversion, first adding means for adding the result of shiftin m bits a result $R_cI_c$ of said first multiplication and the result of shifting m/2 bits a result $R_fI_c$ of said second multiplication, second adding means for adding the result of shifting m/2 bits a result $R_cI_f$ of said third multiplication and a result $R_fI_f$ of said fourth multiplication, and third adding means for adding an output of said first adding means and an output of said second adding means.

2. An A/D converter according to claim 1, wherein said first digital code calculating means comprises first power supply means for applying a plurality of reference voltages set with a predetermined difference between successive reference voltages, first comparing means for comparing said analog input data with said plurality of reference voltages applied by said first power supply means, a first determining circuit responsive to an output of said first comparing means for determining the relation in magnitude between said analog input data and said plurality of reference voltages applied by said first power supply means and calculating said first digital code Ic, and said second digital code calculating means comprises second power supply means for applying a plurality of reference voltages set with a difference which is narrower than said predetermined difference, second comparing means for comparing said analogue input data with said plurality of reference voltages applied by said second power supply means, and a second determining circuit responsive to an output of said second comparing means for determining the relation in magnitude between said analogue input data and said plurality of reference voltages applied by said second power supply means and calculating said second digital code If.

3. An A/D converter according to claim 1, wherein said multiplying means comprises logical operation means for performing a predetermined logical operation on the digital code outputted from said first selecting means, and control signal generating means responsive to the digital signal outputted from said second selecting means for generating a signal for controlling said logical operation means.

4. An A/D converter according to claim 1, which further comprises means for supplying a first clock signal for switching said first selecting means at predetermined timing, and means for supplying a second clock signal for switching said second selecting means at predetermined timing, the period of said first clock signal being twice that of said second clock signal.

5. An A/D converter according to claim 1, which further comprises first, second, third and fourth holding means for individually holding the results obtained by said first, second, third and fourth multiplications, and third selecting means for distributing the multiplied results sequentially obtained by said multiplying means to said first, second, third and fourth holding means in order.

* * * * *